United States Patent
Smith, Jr. et al.

[11] Patent Number: 5,863,348
[45] Date of Patent: Jan. 26, 1999

[54] PROGRAMMABLE METHOD FOR CLEANING SEMICONDUCTOR ELEMENTS

[75] Inventors: William Charles Smith, Jr., Verbank; Donn Allan Lord, Hyde Park, both of N.Y.

[73] Assignee: International Business Machines Corporation, Armonk, N.Y.

[21] Appl. No.: 171,953

[22] Filed: Dec. 22, 1993

[51] Int. Cl.⁶ ..................................................... B08B 7/04
[52] U.S. Cl. .................................. 134/18; 134/2; 134/19; 134/33
[58] Field of Search .................................. 134/2, 18, 19, 134/25.1, 25.4, 33, 1.3

[56] References Cited

U.S. PATENT DOCUMENTS

| | | | |
|---|---|---|---|
| 3,489,608 | 1/1970 | Jacobs et al. | 134/25 |
| 3,607,478 | 9/1971 | Henninges et al. | 156/17 |
| 3,977,926 | 8/1976 | Johnson, Jr. et al. | 156/17 |
| 4,027,686 | 6/1977 | Shortes et al. | 134/33 |
| 4,112,454 | 9/1978 | Harvey | 354/330 |
| 4,197,000 | 4/1980 | Blackwood | 354/323 |
| 4,489,740 | 12/1984 | Rattan et al. | 134/140 |
| 4,519,846 | 5/1985 | Aigo | 134/15 |
| 4,677,758 | 7/1987 | Aigo | 34/58 |
| 4,795,497 | 1/1989 | McConnell et al. | 134/18 |
| 4,895,177 | 1/1990 | Niblett et al. | 134/140 |
| 5,030,293 | 7/1991 | Rich et al. | 134/32 |
| 5,221,360 | 6/1993 | Thompson et al. | 134/33 |

FOREIGN PATENT DOCUMENTS

| | | |
|---|---|---|
| PUPA61-202434 | 9/1986 | Japan . |
| 568682 | 8/1977 | U.S.S.R. . |

OTHER PUBLICATIONS

IBM Tech. Disclosure Bulletin, vol. 19, No. 9, Feb. 1977 "Flux Removal Tool", R.G. Christensen and F.P. Koverda.
ACCEL "Microcel Centrifugal Cleaning Systems" (1989) (no month avail).

*Primary Examiner*—Karen M. Hastings
*Assistant Examiner*—Sean Vincent
*Attorney, Agent, or Firm*—Floyd A. Gonzalez

[57] ABSTRACT

Method and apparatus for cleaning a workpiece such as a semiconductor element in which the element is placed on a chuck mounted on a rotation mechanism in which the rotation mechanism rotates around a first axis, and the element to be cleaned rotates around a second axis spaced from the first axis in a planetary manner. The cleaning process is programmed such that the element may be sprayed, immersed for a soak or pre-soak step, immersed while spinning, sprayed while spinning, and dried by heated gas, or any combination of these. The cleaning program is performed in a single chamber, which may be heated to a desired temperature.

27 Claims, 8 Drawing Sheets

PROGRAMMABLE METHOD FOR CLEANING SEMICONDUCTOR ELEMENTS

BACKGROUND OF THE INVENTION

This invention relates generally to the cleaning of semiconductor elements and, more particularly to a programmable method and apparatus for cleaning the surface of wafers, pre-cleaning circuit boards for assembly, removing flux from assembled circuit boards, and cleaning failed circuit boards prior to and during repair.

Cleaning of semiconductor surfaces is often necessary in the manufacturing of semiconductor products such as wafers, circuit boards, and the like. Cleaning may be required at various stages of processing, such as preparing surfaces for later processing, removing materials such as flux or photoresist, removing debris and contaminants, or cleaning surfaces before rework or repair. Proper cleaning of surfaces in the manufacturing process is important since inadequately cleaned surfaces can lead to quality problems of in-process failures, low yields, or reduced operating performance.

U.S. Pat. No. 3,489,608 issued Jan. 13, 1970 to Jacobs et al. for "Method and Apparatus for Treating Semiconductor Wafers" discloses the cleaning of wafers upon a rotating turntable within a chamber. Each wafer is held on a pedestal by a vacuum chuck around the periphery of the table surface. Liquid is dispensed onto the wafers from above while the turntable rotates about an axis perpendicular to the table center. After cleaning, gas is provided to dry the wafers.

U.S. Pat. No. 4,027,686 issued Jun. 7, 1977 to Shortes et al. for "Method and Apparatus for Cleaning the Surface of a Semiconductor Slice with a Liquid Spray of De-ionized Water" discloses a cleaning apparatus in which a wafer is held on a pedestal in a cleaning chamber with three nozzles directed at angles to the wafer surface. The pedestal has a vacuum chuck for holding the wafer in position, and the pedestal is turned to rotate the wafer. During rotation of the wafer around an axis perpendicular to its supporting pedestal, the first nozzle delivers high pressure de-ionized water, and then a second nozzle delivers lower pressure de-ionized water. After cleaning, gas is provided through the third nozzle for drying.

U.S. Pat. No. 4,112,454 issued Sep. 5, 1978 to Harvey et al. for "Method and Apparatus for Treating Elements of Photographic Film" discloses the immersion in a solution of a spindle holding film discs which are stacked in parallel layers upon the periphery of the spindle. The spindle is rotated around an axis through the center of the spindle to provide motion between the discs and the solution. A motor above the immersion chamber is attached to the spindle to provide rotational motion.

U.S. Pat. No. 4,197,000 issued Apr. 8, 1980 to Blackwood for "Positive Developing Method and Apparatus" discloses a stack of semiconductor wafers within a chamber which is rotated upon an axis through the center of the stack. Sprayers along the side walls of the chamber direct a liquid upon the rotating stack to remove photoresist from the wafers. The same sprayers are also used to rinse the wafers with de-ionized water, and then to provide a heated drying gas.

U.S. Pat. No. 4,489,740 issued Dec. 25, 1984 to Rattan et al. for "Disc Cleaning Machine" discloses an apparatus for rotating an annular disk around a central vertical axis while upper and lower nozzles dispense fluid as the nozzles sweep across the disc. Further, extensible arms may be provided from the center spindle which operate by centrifugal force to hold the disc in place during spindle rotation.

U.S. Pat. No. 4,519,846 issued May 28, 1985 to Aigo for "Process for Washing and Drying a Semiconductor Element" discloses a process for holding a semiconductor element over a water-washing tank while an upper sprayer and lower sprayers dispense water on either side of the element. After spraying, nitrogen gas through an upper nozzle drys one surface of the element. The element is then spun dry by being held upon platform by a vacuum chuck and rotated around an axis perpendicular to the platform.

Japanese PUPA No. 61-202334 published Sep. 8, 1986 for "Plate Work Treatment Unit" discloses a pan type dipping tank for immersing a plate in a liquid while the plate rotates around an axis perpendicular to plate. Valves in the tank are provided for adding and removing fluid. A suction head holds the plate in place by vacuum suction. Additionally, a sprayer may be positioned above the tank for dispensing liquid onto the plate during processing.

U.S. Pat. No. 4,677,759 issued Jul. 7, 1987 to Aigo for "Spin Drier for Semiconductor Material" discloses a drier apparatus having a table with semiconductor material arranged upon chucks located upon the periphery of the table surface. The table is rotated around a axis perpendicular to the table by a vertical shaft connected to a motor. Each material is held in position by a chuck having a spring and weight, such that the centrifugal force of the spin turns the material 90 degrees to position a ledge covering the material's edge.

U.S. Pat. No. 4,895,117 issued Jan. 23, 1990 to Niblet et al. for "Circuit Board Cleaning Apparatus" discloses the immersion in liquid of a carousel holding two circuit board, which are positioned at an angle to the lower plane of the tank. Cleaning is provided by agitating the boards in a solvent using reciprocal rotating motion of the carousel via a motor connected by a shaft at the center of the carousel.

U.S. Pat. No. 5,030,293 issued Jul. 9, 1991 to Rich et al. for "Method and Apparatus for Circuit Board Cleaning" discloses cleaning a circuit board by immersing a circuit board in liquid, and spraying liquids onto the circuit board in a chamber. The immersing or spraying is performed with either vertical oscillation of the board, or rotation about an axis perpendicular to the circuit board. Both motions are provided by an upper mechanism attached to a motor at one end, and at the other end, to arms extending to the edges of the circuit board. Sprayers are located circumferencily along the side walls of the chamber for directing fluids onto the board's upper portion, while a sprayer is located at the chamber bottom to direct fluids upon the board's lower portion. A valve assembly adds and drains liquids from the chamber. The board is dried by a hot, dry gas passed through the same sprayers. A board is loaded and removed from the chamber by a conveyer, and is automatically aligned in the chamber by the arms of the upper assembly.

IBM Technical Disclosure Bulletin, Vol. 19, No. 9, February 1977, pp. 3396—3396, shows a flux removal tool having substrates held in a flat carriage. The carriage is attached to a pivot connected to an upper rotary drive, and angled to the rotational axis of the rotary drive at the pivot. During the rotation of the carriage within a flow of an immersion liquid, the angle may be varied to provide optimum pressure of the liquid onto the substrate surface.

The advertising brochure MICROCEL Centrifugal Cleaning System from ACCEL Corp. dated 1989, advertises a programmable cleaning system for cleaning printed circuit boards in which the circuit board spins above the center of gravity to provide washing, rinsing and drying under tightly spaced components.

SUMMARY OF THE INVENTION

The present invention cleans one or more semiconductor elements by placing the elements upon a rotation structure within a sealed chamber. The rotation structure is located in a tank which contains liquids that may be applied to the elements. The rotation structure is spun by a planetary gear arrangement around two rotational axes while cleaning liquids are sprayed on the elements, or the elements are immersed and soaked in a cleaning liquid, with or without spinning.

Spraying is provided by nozzles mounted on arms extending from the upper housing 12 of the chamber. Liquids added to the chamber during spraying or immersion, are removed by a drain. Either spraying or immersion steps, with or without spinning, may be repeated as necessary to sufficiently clean the elements. After cleaning is completed, elements are exposed to an inert gas for drying. The chamber may be heated to a desired temperature by circulating heated oil between double walls of the chamber. The entire operation is controlled and programmed by a computer.

The planetary gear structure for spinning the elements has a first means for rotating the entire structure around an axis perpendicular to the center of the structure and through the radial center of the structure, and a second means for rotating each element around a second axis. The planetary gear structure may be designed to rotate either in the same or the opposite direction as the rotation of the first axis. A chuck is provided for holding each element during the spinning of the planetary gear structure. Further, each chuck has a structure with arms which pivot to lock the element in place during rotation, while pivoting to release the element when no rotation is present.

It is an object of the present invention to provide for improved cleaning of workpieces by rotating one or more workpieces around two rotational axes.

It is a further object of the present invention to provide for programming sequences of immersing, soaking, and spraying steps in a single chamber for cleaning multiple semiconductor elements.

It is yet another object of the invention is to provide for a chuck having arms which pivot to hold the wafers during spinning of the rotation structure, and release when no spin is present.

The foregoing and other objects, features and advantages of the invention will be apparent from the following more particular description of the preferred embodiment of the invention as illustrated in the drawings.

DESCRIPTION OF THE PREFERRED EMBODIMENT

Figure 1:
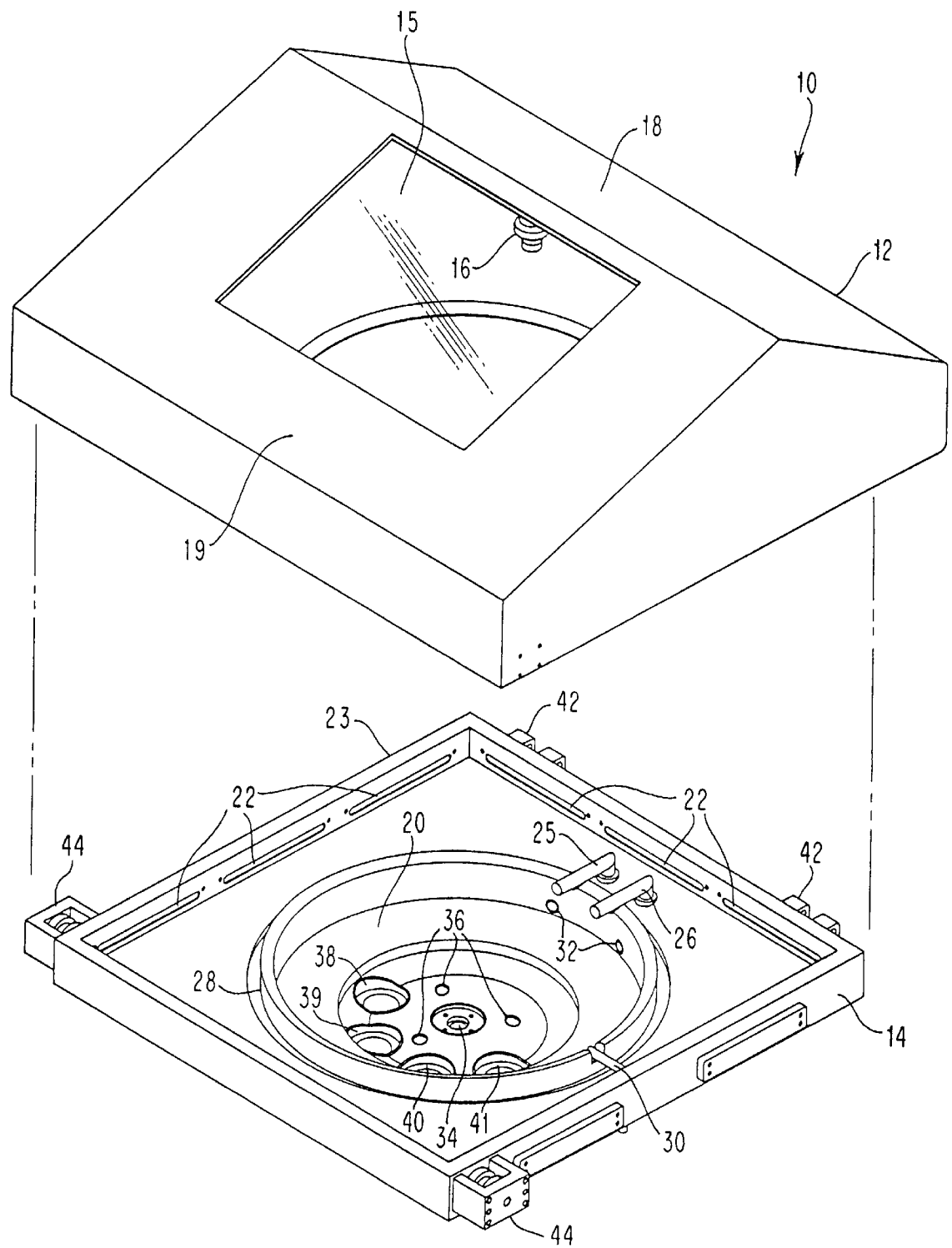
FIG. 1 is a drawing of the upper and lower housing of the chamber of the present invention.

FIG. 1 is an exploded view of the enclosed chamber 10 of the present invention. The chamber 10 has an upper housing 12 and a lower housing 14. The upper housing 12 has a viewing window 15 through which the cleaning operation may be viewed, and a spray nozzle 16 for spraying cleaning liquid, rinsing liquid or drying gas as desired. The nozzle 16 is supplied with both a liquid and an inert gas such as nitrogen gas during a chamber cleaning operation. The sides 18 and 19 of the upper housing 12 are pitched to place the spraying nozzle 16 a desired distance above the chamber such that the chamber may be cleaned to remove debris and cleaning chemicals from the chamber after cleaning of the workpiece.

Figure 6:
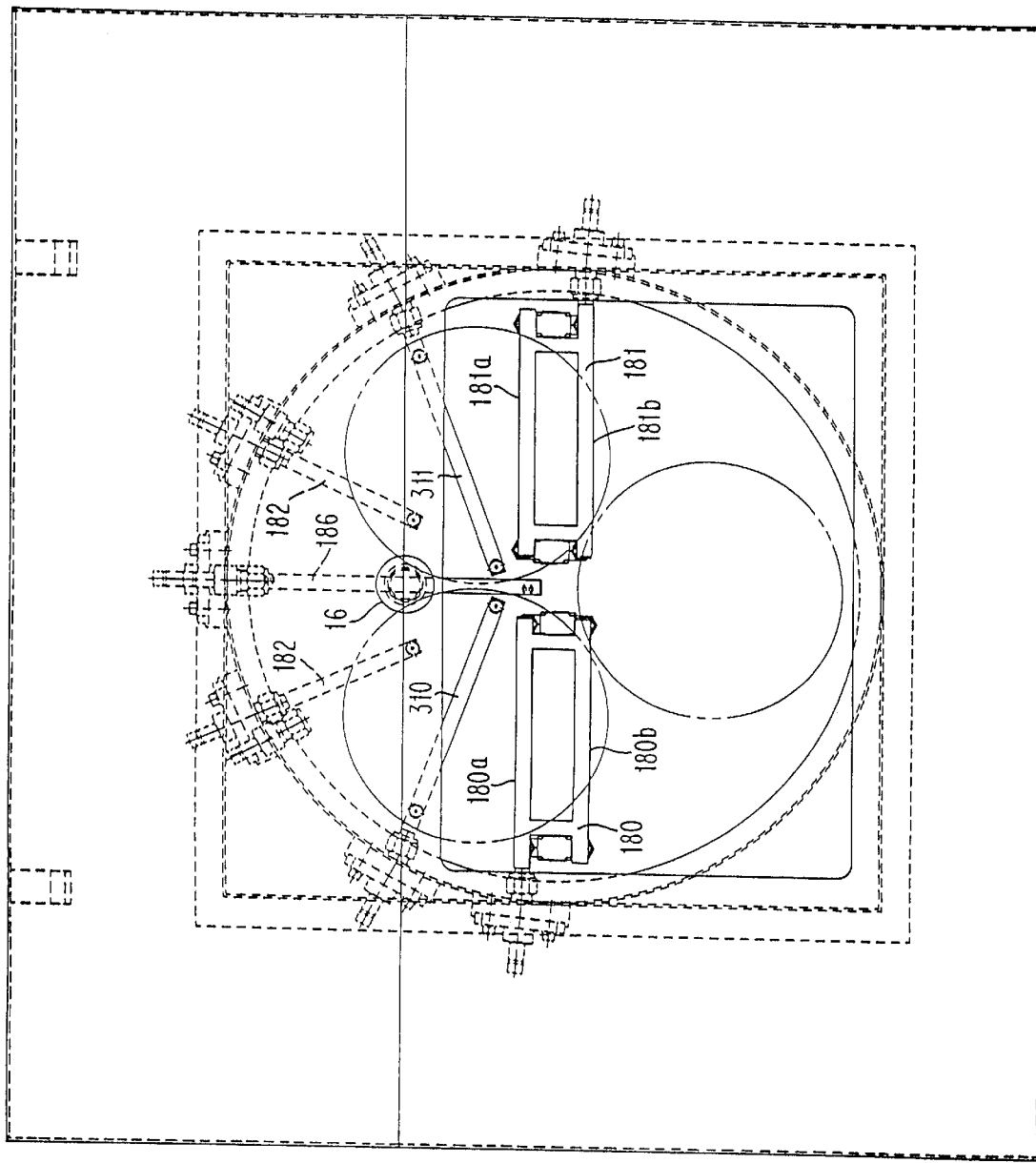
FIG. 6 is top view of the invention showing sprayers arms and dryer arms.

The lower housing 14 has an integral tank 20 surrounded by a side wall 23 in which are located a plurality of vents 22 for venting vapors during the cleaning process. It will be understood that a sealing means such as a rubber or other elastomeric seal that is compatible with the chemicals used in cleaning may be provided between the upper housing 12 and the lower housing 14 such that a cleaning process using toxic chemicals may be safely conducted, and that toxic vapors may be exhausted through the vents 22 while inserting inert gas through gas input ports into the chamber 10 in the last step of the process, as will be discussed further. A first and second fill tube 25 and 26 are provided for filling the tank 20, and an overflow channel 28 is located around the periphery of the tank 20 to catch liquids which may overflow the tank 20. A level sensor 30 is located at the top of the tank 20 to be used to sense when the tank 20 is full. A pair of thermocouples 32 are provided to measure the temperature inside the tank 20, as will be explained. Further, a pair of gas drying ports in arms 310 and 311 of FIG. 6 are provided to inject drying gas into the tank 20 during the drying step. A central opening 34 is provided in the floor of the tank 20 to receive a rotation mechanism for rotating workpieces to be cleaned, as will be explained. The central opening is surrounded by gas bubbler ports 36 through which inert gas, such as nitrogen, may be injected to agitate cleaning liquid in the tank 20 during a cleaning operation, as desired. Drains 38, 39, 40 and 41 are provided in the floor of the tank 20 to drain chemicals in the tank 20. For instance, two of the drains might return to a reservoir, one for a cleaning liquid and one for a rinsing liquid, such that the liquids could be reused, one drain is connected to a waste to dispose of the liquid being drained, and one drain is used to safely dispose of toxic chemicals to a proper storage facility.

One edge of the upper and lower housings 12 and 14 are joined by hinges 42 (FIG. 1 is shown in an exploded view for clarity) to allow the chamber 10 to be opened to add elements to be cleaned. Locks 44, such as shot-pin locks, may be used to lock the chamber 10 closed during a cleaning operation. Further, the locks 44 may be controlled by the computer controlling the cleaning operation such that the chamber 10 may not be opened during an operation. This is particularly important when the chemicals being used are toxic to prevent the inadvertent exposure to the chemicals being used.

Figure 2:
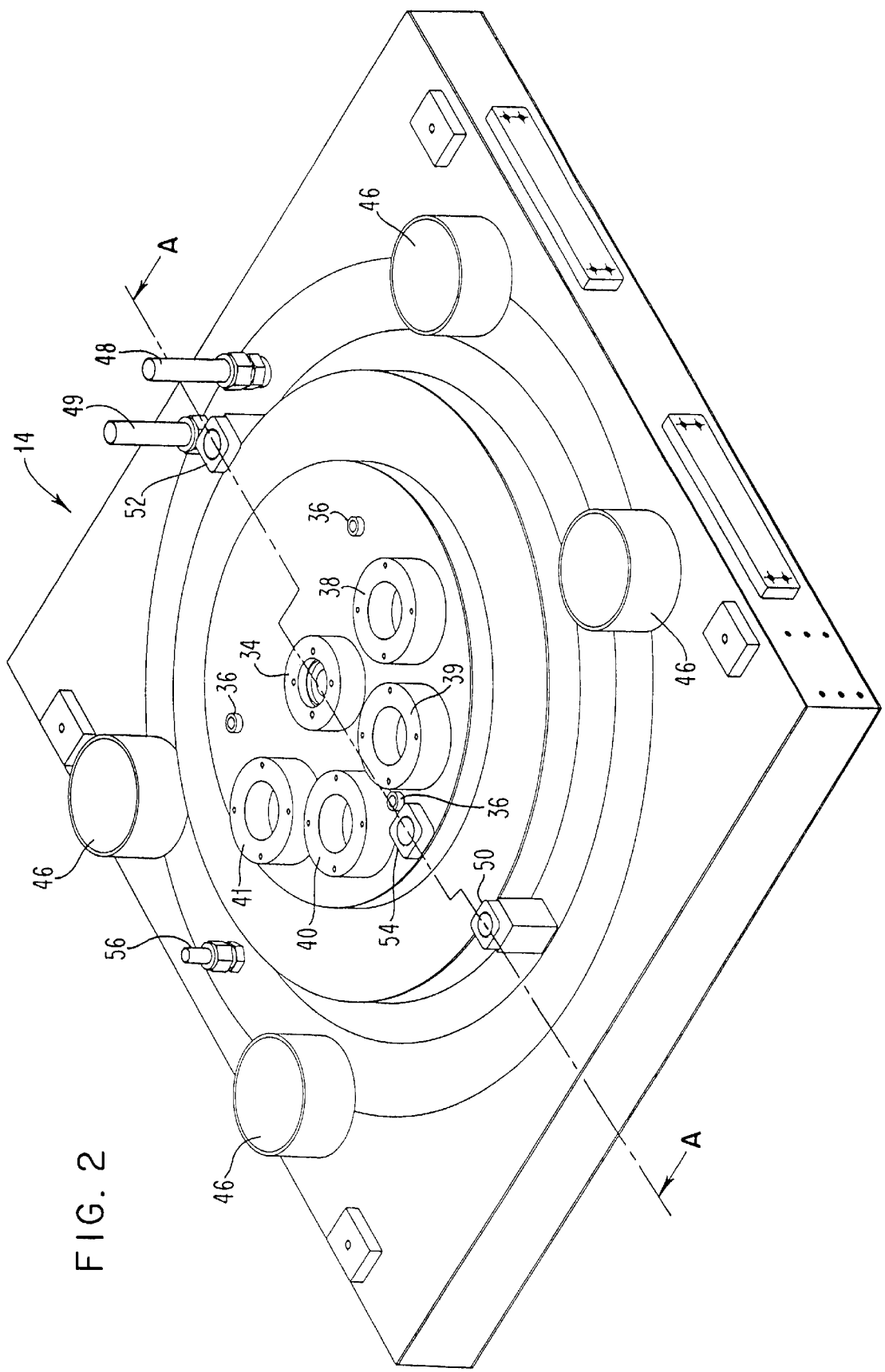
FIG. 2 is a bottom view of the lower housing in FIG. 1.

FIG. 2 is a bottom perspective view of the lower housing 14 of FIG. 1. Ducts 46 are connected to the vents 22 of FIG. 1. The fill tubes 25 and 26 are connected to supply lines 48 and 49, respectively. A drain tube 50 is connected to the overflow channel 28 for recovering chemicals from the overflow channel 28, as will be explained. The central opening 34, as well as the gas bubbler ports 36 and the drains 38–41 are shown. A heated oil input port 52 and a heated oil output port 54 is provided to circulate heated oil around the tank 20, to heat the tank to a desired temperature, as will be explained. The connector 56 is connected to the mentioned pair of gas drying ports for supplying drying gas into the sealed chamber.

Figure 3:
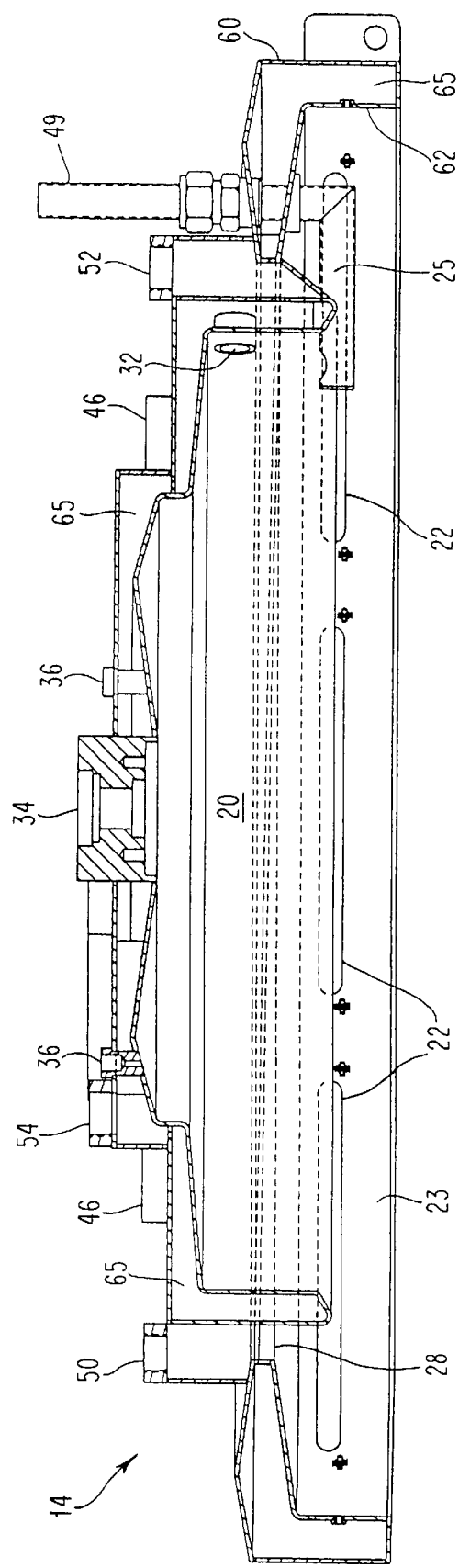
FIG. 3 is a cross-sectional view of the lower housing taken along section line A—A of FIG. 2.

FIG. 3 is a sectional view taken along section line A—A of FIG. 2. The tank 20 has double walls, an outer wall 60 and an inner wall 61, with a space 65 therebetween. The hot oil input port 52 and output port 54 communicate with the space 65 such that heated oil may be circulated between the outer wall 60 and the inner wall 62 to heat the tank 20 to a desired temperature.

Figure 4:
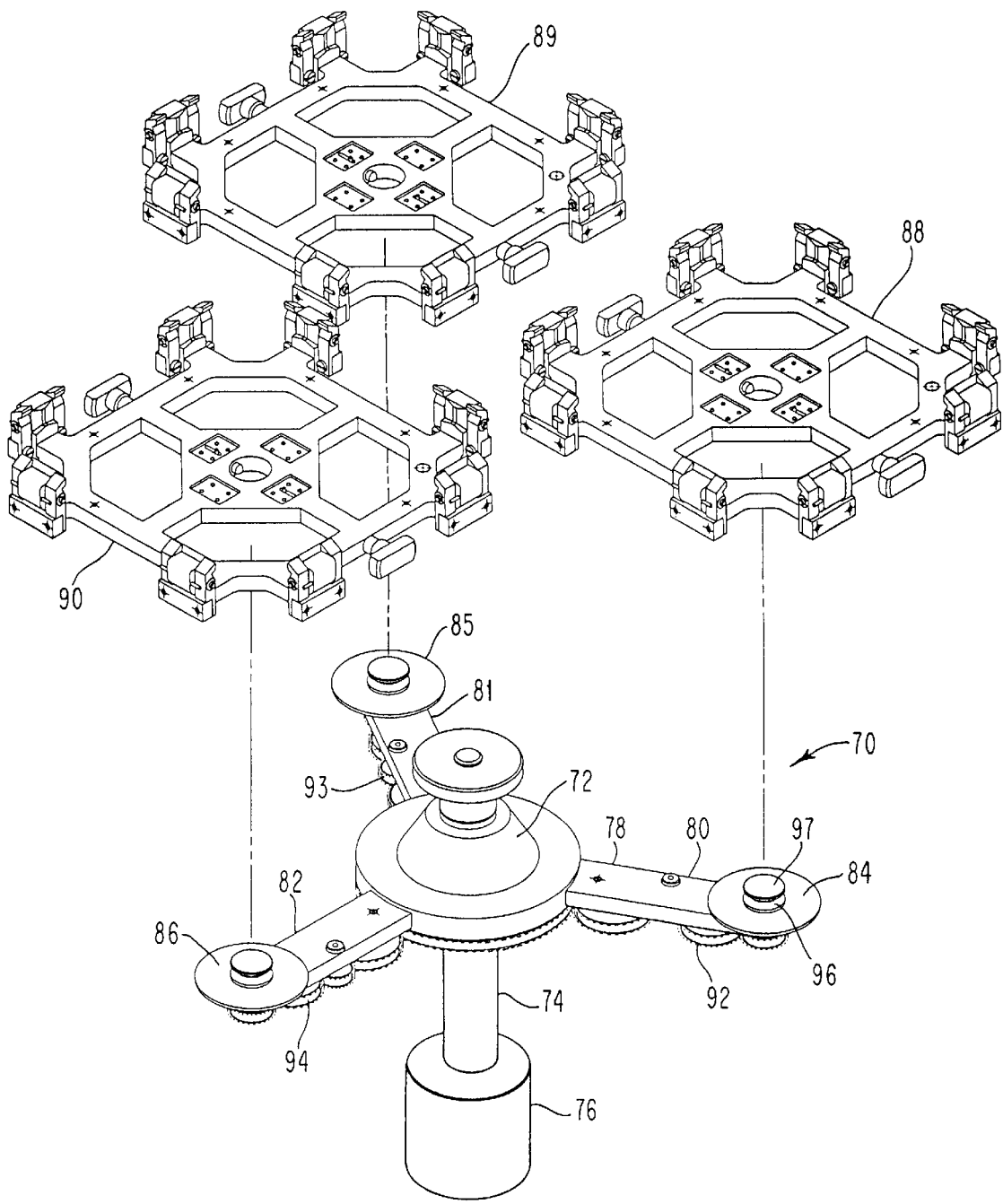
FIG. 4 is a drawing of the rotation structure and chuck of the present invention.

FIG. 4 is an exploded perspective view of the rotation structure 70 of the invention. The rotation structure 70 has a spindle assembly 72 mounted on a shaft 74 which is driven by a motor 76. The shaft 74 passes through the central opening 34 in the floor of the tank 20 shown in FIGS. 1, 2 and 3. The rotation mechanism 70 includes a spider member 78 having three equally spaced arms 80, 81 and 82 extending radially outwardly from the spindle assembly 72. At the end of each arm 80–82 is a capstan 84–86, respectively, on which is releasably mounted a rotatable turntable or chuck member 88–90, respectively. Each capstan 84–86 is driven by a gear train 92–94, respectively, such that the rotation mechanism 70 rotates about a first vertical axis centered on the shaft 74, and each capstan 84–86 rotates about a second vertical axis centered on the capstan 84–86 itself in a planetary arrangement.

Figure 4A:
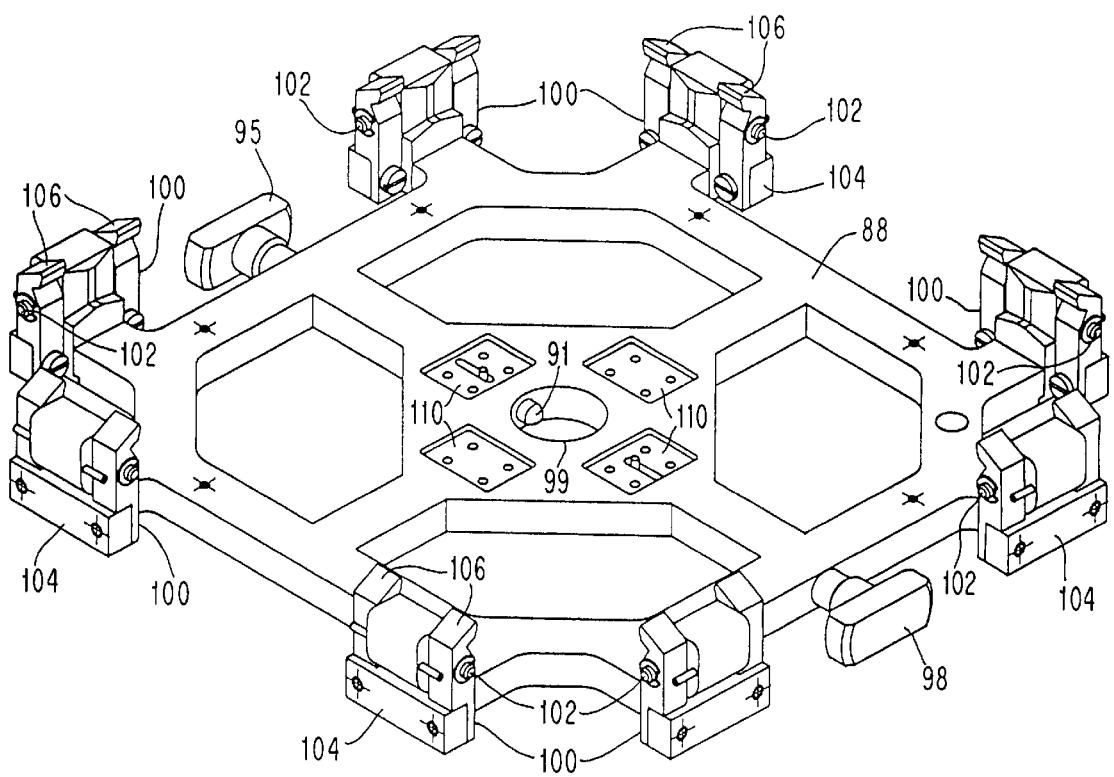
FIG. 4A is a drawing of the chuck shown of FIG. 4.

FIG. 4A is a perspective view of one Chuck 88 of the turntables or chucks 88–90 of FIG. 4. The Chuck 88 is mounted on a capstan 84 by means of a rod end 91 in a central opening 99 for receiving the central spindle 97 of the capstan 84 (see FIG. 4). The rod end 91 is the end of a spring-loaded rod controlled by handle 95, and is sized to fit into a corresponding grove 96 in the spindle 97 of the capstan 84 for forming a detent to quickly and securely attach the chuck 88 over the capstan 84. A second detent mechanism 98 is also provided to more securely hold the chuck in place. A plurality of fly-weights having arms 100 are positioned around the periphery of the chuck 88, each pivoting around a pin 102. One end of the fly-weight arm 100 has a counter-weight 104, and the other end has a pair of fingers 106. When the chuck 88 is spinning, the fly-weight arms 100 pivot outwardly around the pin 102, responsive to centrifugal force, to a first position (not shown) grasping a work piece with their fingers 106. When the spinning stops, the fly-weight arms 100 pivot around the pin responsive to the counter-weight 104, to a second position (shown in FIG. 4A), releasing the work piece. Positioning screw-holes 110 are provided such that dogs may be added to the chucks to divide the surface of the chucks in half or fourths such that different sizes of work pieces can be accommodated.

Figure 4B:
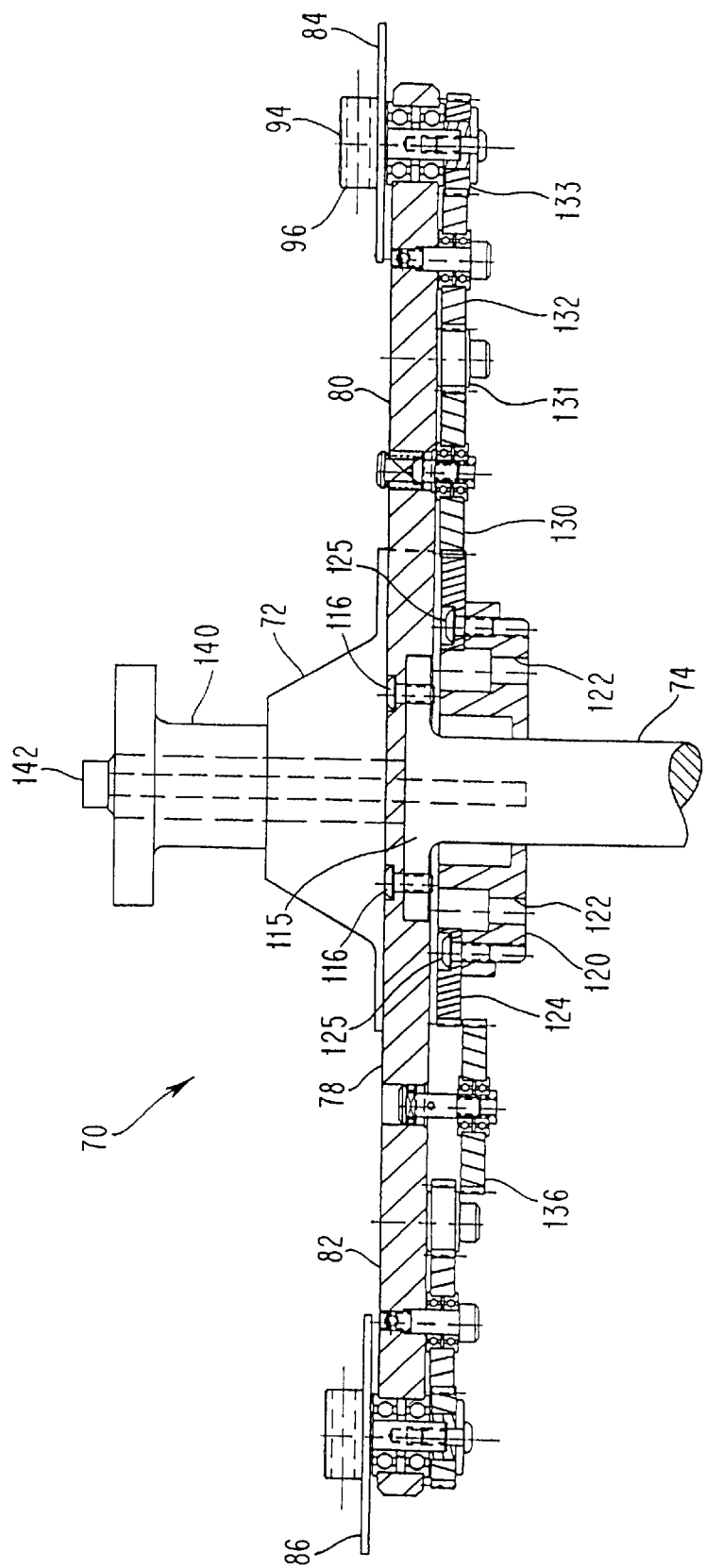
FIG. 4B is a side elevational view of a portion of the rotation structure of FIG. 4 showing the planetary gear structure.

FIG. 4B is a side elevational view of the a portion of the rotation assembly 70 of FIG. 4. The shaft 74 has a flanged end 115 to which is bolted the spider member 78 by bolts 116. A collar member 120 has a central opening for receiving the shaft 74 and is sized to slidably rotate around the shaft 74. It will be understood that the collar member 120 is bolted to the floor of the tank 20 through bolt holes 122. A ring gear 124 is bolted to the collar member 120 by bolts 125. A series of idler gears 130, 131, 132 and 133 are spaced along the arm 80 to transmit rotation to the capstan 84. It will be understood that with the number of idler gears shown in FIGS. 4 and 4B, that the direction of rotation of the capstans will be opposite that of the direction of rotation of the shaft 74, that is, when the shaft 74 is rotated in the clockwise direction, and the capstans rotate in the counter-clockwise direction. It will also be understood that the number of idler gears may be varied to change the rotation of the capstan from being in the opposite direction of rotation as the direction of rotation of the shaft 74, as shown in present embodiment, to being in the same direction of rotation. This is done by having a odd number of idler gears instead of an even number, as shown. The idler gear 130 is provided with an adjustable hub which acts as an isolation device such that it may be moved to a position wherein its gear teeth are disengaged with the teeth on the gear ring 124 and the teeth on the idler gear 131 to prevent rotation from being transmitted to its capstan. Such a disengaged position is shown in FIG. 4B at 136. The speed of rotation of the capstans 84–86 is controlled by the gear ratios of the gears in the gear trains 92–94. The speed of rotation may also be varied by varying the speed of the motor 76. The spindle 74 and an extension 140 are bolted to the end of the shaft 74 by a bolt 142, if desired. The spindle 72 and extension 140 protect the end 115 of the shaft 74 and the drive mechanisms 92–94 from the cleaning chemicals and debris removed from the workpiece during the cleaning process.

The motor 76 may be alternately run forward for between a quarter to a half turn, and then reversed for a similar quarter to half turn to index or agitate the elements in the chucks while the elements are being sprayed or immersed, as desired, to increase agitation of the chemical in the chamber 10 to enhance cleaning.

Figure 5:
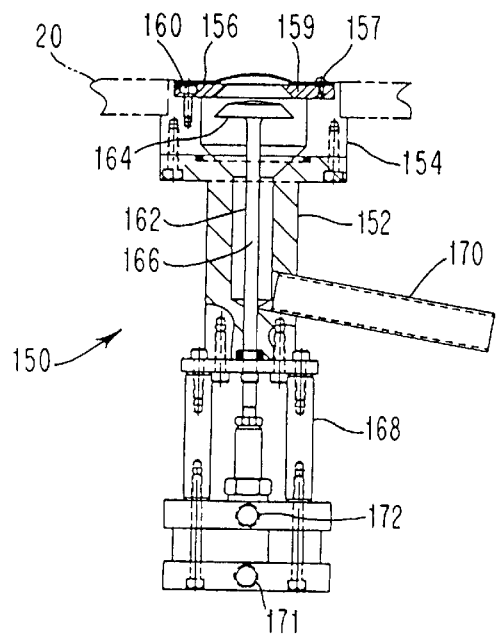
FIG. 5 is a drawing of a drain of the chamber of FIG. 1.

FIG. 5 is a side elevational view of a drain valve 150 of the tank 20 if FIG. 1. The drain valve 150 has a valve body 152 bolted to a collar 154 around a drain, such as drains 38–41 in the floor of the tank 20 of FIG. 1. A screen 156 is fastened by screws 157 to the inside of collar 154. A valve seat 159 bolted to the collar 154 by fastener 160. A valve member 162 having a valve head 164 and a valve stem 166 are centered inside the valve body 152 to engage with the valve seat 159. It will be understood that the edges of the valve seat 159 and the valve head 164 are tapered to co-operate with one another to make a liquid-tight seal. The valve stem 166 is actuated by a pneumatic cylinder actuator 168. The valve 150 may be moved between its open and closed positions by applying air pressure to the open and close ports 171 and 172, respectively. The valve body 152 has a drain tube 170 to connect the valve 150 to a drain line.

FIG. 6 is a top elevational view of the spraying and drying mechanism of the invention which is positioned in the chamber 10 above the tank 20. In FIG. 6, the upper housing has a pair of sprayer arm assemblies 180 and 181. As will be explained, arm 180 is used to spray Xylene, and arm 181 is used to spray Isopropyl alcohol (IPA). Each sprayer arm assembly 180 and 181 having a pair of arms 180a, 180b and 181a, 181b, respectively. Each arm 180a, 180b, 181a and 181b has its own set of nozzles, each set of nozzles aimed at adjustable angles to effect better cleaning. Arms 182 are provided having multiple nozzles for adding rinse chemicals. The arms 182 may be used to spray elixir (to be explained) or another chemical, either alone or in combination, as desired. The rinse chemicals may be high pressure water, or other chemical, as desired. Arms 310 and 311 are provided having multiple ports for adding gas to dry the elements after cleaning. A tube 186 having multiple nozzles is provided to spray high pressure deionized (D.I.) water. Even though the arms are placed in half of the housing 12, it will be understood that the coverage on the elements to be cleaned will be uniform because the elements are mounted on the chucks 88–90 and are spinning under the arms 180–182 and 310–311 by the action of the rotation mechanism 70 of FIGS. 4–4A.

Figure 7:
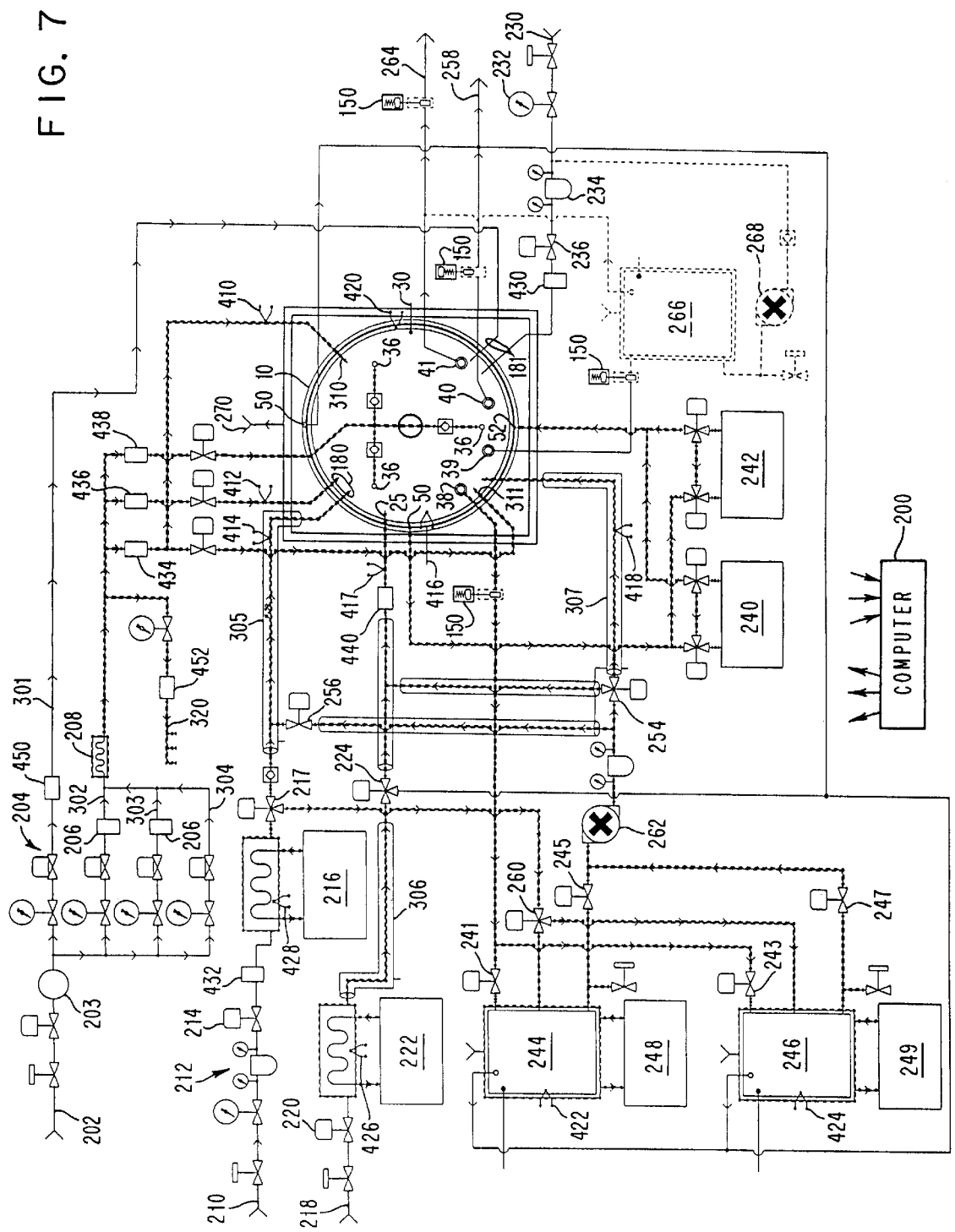
FIG. 7 is a schematic diagram of the present invention.

FIG. 7 is a schematic diagram of the present invention. A computer 200 controls the various valves to control the cleaning process of the cleaning apparatus of the present invention, and is completely programmable such that various combinations of spinning, spraying, immersion and drying may be established for any desired cleaning program. The computer 200 also monitors parameters, such as temperature, flow, quantity, and time, to control the steps in a cleaning operation. A gas supply is connected at 202 for supplying in inert gas such as nitrogen gas. The nitrogen gas is filtered by filter 203, controlled by regulators 204 and measured by flow meter 206, where appropriate, to supply nitrogen at the correct pressures to the chamber 10 to perform various operations. A heater 208 is also provided, to heat the nitrogen to a desired temperature. The nitrogen at 301 is used with the IPA spray from arm 181 of FIG. 6. The nitrogen at 302 is injected into the chamber 10 by arms 310 and 311 of FIG. 6 during the nitrogen dry step, the nitrogen at 303 is used with the Xylene spray from arm 180. The nitrogen at 304 is used for heater purge, and the nitrogen at 320 is used to pressurize the jackets 305–307. A Xylene supply is connected at 210 through a regulator 212 and filter 214, through a heater 216, and finally through supply valve 217 to the Xylene spray arm 180 in the chamber 10. An elixir supply is connected at 218 through valve 220 to a heater 222, and then through supply valve 224 to the elixir fill 25. The elixir may be a 75% Xylene and 25% flux by weight. An IPA supply is connected at 230 through a regulator 232 and a filter 234, through supply valve 236, and to the IPA spray arm 181 of the chamber 10. The IPA supply could, alternately, be used for de-ionized (D.I.) water, or a separate supply for de-ionized water could be provided. A heated oil flow is provided between output port 50 and input port 52 through heaters 240 and 242, to heat the chamber 10 to a desired temperature, as previously discussed.

The Xylene is recovered through the Xylene recover drain 38 and valves 241 and 243 to a pair of Xylene reservoirs 244 and 246, which are heated by heaters 248 and 249, respectively. The recovered Xylene may then be recirculated back to the chamber 10 through the supply valve 224 to the fill 25, or through valves 245 or 247 and through valve 254 to the fill 25. If desired, the Xylene may also be supplied to the spray 16 through valves 245 or 247, and then through a supply valve 256. Finally, the Xylene may be disposed of by Xylene waste drain 40 to the Xylene drain at 258. The overflow drain tube 50 is connected to the valve 224 such that liquid caught in the overflow is recirculated back to the fill 25.

If desired, the elixir may be stored in the reservoirs 244 and 246 through valves 217 and 260 and recirculated to the chamber 10 as described. An air pump 262 is provided to supply the chemical stored in the reservoirs 244 and 246 to either spray or fill at the correct pressure.

The IPA is provided to spray arm 181, and is then drained from IPA waste drain 41 to the drain 264. Optionally, an IPA reservoir 266 may be provided to store the IPA, and then supplied at the correct pressure to spray by an air pump 268. In this case, an IPA recover drain 39 is used to drain IPA from the chamber 10 back to the reservoir for reuse. A vent exhaust 270 is provided to exhaust gas and chemical vapor from the chamber 10 as previously explained. As previously discussed, each of the drains 38–41 is controlled by a drain valve 150, as shown in FIG. 7. The preferred heaters for heaters 216, 222, 244, 249, 140 and 242 are Haake Heat Circulators.

Temperature sensors 410–428 provided at various points and connected to the computer 200 to allow the computer 200 to monitor the temperature of critical points throughout the cleaning process. Also, flow meters 430–432 are provided to measure the quantity of flow, and flow sensors 434–440 are used to detect flow. Pressure switches 450–452 detect the presence of a set pressure in the nitrogen lines.

The processing of elements is controlled and programmed by the computer 200. This computer allows a user to program the sequence of cleaning steps, as well as events within such steps. Further, the computer 200 monitors sensors within the apparatus, and adjusts variables of operation such as temperature, time, rotation rate, valve positions, and others required for processing.

In operation, several steps may be carried out in the chamber. One step is spraying elements with a liquid while the elements are spun upon rotation structure 70. The spinning during spraying allows liquid to impact at various angles of incident to element surfaces. Another step is immersion of the elements in a liquid, and then spinning the elements on structure 70 such that the first rotation axis of the elements creates a circular vortex flow within the chamber, and the second rotational axis spins the elements opposite this flow to impact the liquid onto the surface of the elements. This second axis of rotation of the elements provides an efficient means of cleaning or rinsing element surfaces. A soaking pre-step to immersion may be provided, or such soaking may be an entirely separate step. Soaking occurs by immersing the elements in a liquid and not rotating structure 70. Further, nitrogen bubbling from bubbler ports 36 as described may be provided while the elements are immersed during spinning or soaking. Liquid may be removed by drains 38–41 between steps, as desired. Further, elements may be spun dry on the rotational structure 70 between steps. A final step before removal of the elements from the chamber is supplying a drying gas, while the elements are spun. Finally, the chamber 10 itself may be cleaned by spraying either water or other chemical from the nozzle 16, either before of after the elements are removed from the chamber 10, as desired.

The above cleaning steps are sequenced in an order programmed by the user in the computer 200. This cleaning may be separated into cleaning and rinsing operations, where the liquids supplied to the chamber are cleaning and rinsing agents, respectively. Further, processing may be limited to performing specific steps absent other steps. This can occur if the apparatus is used only for spraying, or immersion with or without prior soaking.

The following are examples of the possible cleaning operations of the present invention:

A0 Clean

Purpose

To remove particulate contamination and laser debris from the surface of the substrate. This operation is performed prior to placing components on the substrate.

| Step | Spray Pressure (psi) | RPMs | Temp (C.) | Time (min) |
| --- | --- | --- | --- | --- |
| 1. D.I. Water Spray | 1000 | 250 | Ambient | 3 |
| 2. High RPM Spin | — | 1000 | Ambient | 0.5 |
| 3. IPA Spray | 15 | 250 | Ambient | 1 |

-continued

| Step | Spray Pressure (psi) | RPMs | Temp (C.) | Time (min) |
|---|---|---|---|---|
| 4. High RPM Spin | — | 1000 | Ambient | 0.5 |
| 5. Nitrogen Dry | 15 | 250 | 90 | 3 |

NOTES:
Nozzles are positioned above the product.
Cleaning is performed by mechanical impact of chemical being sprayed.
Product is not processed through an immersion cycle.
Two axis of rotation are used.
Part is secured horizontally to rotating assembly which is attached to bottom of tank.

Pre-Process Clean

Purpose

To remove particulate, ionic and non-ionic contamination from the surface of the substrate. This operation is performed prior to component place.

| Step | Spray Pressure (psi) | RPMs | Temp (C.) | Time (min) |
|---|---|---|---|---|
| 1. D.I. Water Spray | 350 | 250 | Ambient | 3 |
| 2. High RPM Spin | — | 1000 | Ambient | 0.5 |
| 3. IPA Spray | 15 | 250 | Ambient | 1 |
| 4. High RPM Spin | — | 1000 | Ambient | 0.5 |
| 5. Nitrogen Dry | 15 | 250 | 90 | 3 |

NOTES:
Nozzles are positioned above the product.
Cleaning is performed by mechanical impact of chemical being sprayed.
Product is not processed through an immersion cycle.
Two axis of rotation are used.
Part is secured horizontally to rotating assembly which is attached to bottom of tank.

Pre-Assembly Clean

Purpose

To remove particulate, ionic and non-ionic contamination from the surface of the substrate and components. This operation is performed after component place and prior to module assembly.

| Step | Spray Pressure (psi) | RPMs | Temp (C.) | Time (min) |
|---|---|---|---|---|
| 1. D.I. Water Spray | 350 | 250 | Ambient | 3 |
| 2. High RPM Spin | — | 1000 | Ambient | 0.5 |
| 3. IPA Spray | 15 | 250 | Ambient | 1 |
| 4. High RPM Spin | — | 1000 | Ambient | 0.5 |
| 5. Nitrogen Dry | 15 | 250 | 90 | 3 |

NOTES:
Nozzles are positioned above the product.
Cleaning is performed by mechanical impact of chemical being sprayed.
Product is not processed through an immersion cycle.
Two axis of rotation are used.
Part is secured horizontally to rotating assembly which is attached to bottom of tank.

Flux Clean Process

Purpose

To clean flux from an assembled board after a soldering process.

Process steps: (modules are oriented horizontally)
(a) Elixir (75% Xylene and 25% flux by weight) spray for 5 minutes at 45 C.,
Spray pressure: 15 psi,
RPM: 30.
(b) Xylene immersion for with nitrogen bubbles 10 minutes at 90 C.
(c) Xylene spray for 10 minutes at 90 C.,
Spray pressure: 15 psi,
RPM: 800.
(d) IPA spray for 2 minutes at 25 C.,
Spray pressure: 15 psi,
RPM: 100.
(e) Nitrogen dry for 3 minutes at 90 C.,
Spray pressure: 15 psi,
RPM: 200.
NOTE: IPA—Isopropyl alcohol
Tolerances
Time +/−10 seconds
Temperature +/−3 C.
Spray pressure +/−3 psi
RPM +/−5

Paste Clean Process

Process

To clean thermal paste from a faulty assembled module before the module is returned for repair.

Process steps: (modules are oriented horizontally)
(a) Xylene spray for 10 minutes at 90 C.,
Spray pressure: 15 psi,
RPM: 100.
(b) Xylene immersion with nitrogen bubbles for 10 minutes at 90 C.
(c) Xylene spray for 10 minutes at 90 C.,
Spray pressure: 15 psi,
RPM: 100.
(d) IPA spray for 1 minute at 25 C.,
Spray pressure: 15 psi,
RPM: 100.
(e) Deionized water spray for 3 minutes at 25 C.,
Spray pressure: 1000 psi,
RPM: 30.
(f) IPA spray for 1 minute at 25 C.,
Spray pressure: 15 psi,
RPM: 100.
(g) Nitrogen dry for 5 minutes at 90 C.,
Spray pressure: 15 psi,
RPM: 100.
Tolerances
Time +/−10 seconds
Temperature +/−3 C.
Spray pressure +/−3 psi
RPM +/−5

While we have illustrated and described the preferred embodiment of our invention, it is to be understood that we do not limit ourselves to the precise construction herein disclosed, and the right is reserved to all changes and modifications coming within the scope of the invention as defined in the appended claims.

Having thus described our invention, what we claim as new, and desire to secure by Letters Patent is:

1. A method of cleaning one or more semiconductor elements comprising the steps of:

providing a rotation structure with a means for rotating said elements about a first, central axis, providing said rotation structure with a drive train for rotating said elements about a second axis spaced apart from said first axis, and providing said drive train with an isolation device having a first position for transmitting rotation power for rotating the elements about said second axis and a second position for preventing power from being transmitting over said drive train;

setting said isolation device in either its first or second position;

placing said elements upon said rotation structure within a sealed chamber;

spinning said elements on said rotation structure such that if said isolation device is in said first position, said elements rotate about said first axis and are driven by said drive train to rotate about said second axis, and if said isolation device is in said second position, said elements rotate about said first axis and are not powered by said drive train to rotate about said second axis;

spraying a first liquid onto said elements in said chamber while spinning said elements during said spinning step, wherein said first liquid is one of a cleaning agent and a rinsing agent;

draining said first liquid from said chamber;

stopping said spinning step either during or after said draining step;

immersing said elements in a second liquid in said chamber thereby soaking said elements, wherein said second liquid is one of said cleaning agent and said rinsing agent;

draining said second liquid from said chamber;

repeating one or more of said spraying and immersing steps in the event that said elements are not sufficiently cleaned with said first and said second liquids;

draining any liquid from said chamber after every spraying and immersing step; and exposing said elements to a gas in said chamber to dry said elements.

2. A method as claimed in claim 1 further comprising the step of heating one of said first and second liquids prior to spraying said elements with or immersing said elements in said liquids.

3. A method as claimed in claim 1 further comprising providing at least a portion of said chamber with an inside wall and an outside wall spaced from said inside wall and including the step of heating said chamber by circulating a heated liquid between said inside wall and said outside wall during said cleaning.

4. A method as claimed in claim 1 further comprising the step of venting gases from said chamber.

5. A method as claimed in claim 1 further comprising the step of bubbling a gas through the liquid in said chamber from at least one port in said chamber during said immersing step.

6. A method as claimed in claim 1 wherein said placing of said elements is by positioning each said element onto a chuck located upon said rotation structure, where each chuck has arms which pivot to hold said element during said spinning, and said arms pivot to release said element when said spinning ceases.

7. A method as claimed in claim 1 wherein said gas is nitrogen.

8. A method as claimed in claim 1 wherein said draining step comprises draining said liquid through at least one drain in the bottom of said chamber.

9. A method of cleaning a semiconductor element comprising the steps of:

providing a rotation structure with a means for rotating said element about a first rotational axis, providing said rotation structure with a drive train for rotating said element about a second rotational axis spaced apart from and parallel to said first rotational axis, and providing said drive train with an isolation device having a first position for transmitting rotation power for rotating the element about said second rotational axis and a second position for preventing power from being transmitting over said drive train;

setting said isolation device in either its first or second position;

placing said element upon said rotation structure within a sealed chamber;

spinning said element on said rotation structure such that if said isolation device is in said first position, said element rotates about said first rotational axis and is driven by said drive train to rotate about said second rotational axis, and if said isolation device is in said second position, said element rotates about said first rotational axis and is not powered by said drive train to rotate about said second rotational axis;

spraying a liquid onto said element in said chamber while spinning said element during said spinning step, where said liquid is one of a cleaning agent and a rinsing agent;

removing said liquid from said chamber; and drying said element.

10. A method as claimed in claim 9 further comprising the step of heating said liquid prior to said spraying.

11. A method as claimed in claim 9 further comprising providing at least a portion of said chamber with an inside wall and an outside wall spaced from said inside wall and including the step of heating said chamber by circulating a heated liquid between said inside wall and said outside wall during said cleaning.

12. A method as claimed in claim 9 further comprising the step of venting gases from said chamber.

13. A method as claimed in claim 9 wherein said spinning step further comprises driving said drive train to rotate said element around said second rotational axis in a direction opposite said rotation around said first rotational axis when said isolation device is in said first position.

14. A method as claimed in claim 9 wherein said placing of said element is by positioning said element onto a chuck located upon said rotation structure, where chuck has arms which pivot to lock said element during said spinning step, and said arms pivot to release said element when said spinning step ceases.

15. A method as claimed in claim 9 wherein said drying said element is by exposing said element to a gas.

16. A method as claimed in claim 15 wherein said gas is nitrogen.

17. A method as claimed in claim 9 wherein said removing step comprises draining said liquid through at least one drain in the bottom of said chamber.

18. A method of cleaning a semiconductor element comprising the steps of:

providing a rotation structure with a means for rotating said element about a first axis, providing said rotation structure with a drive train for rotating said element about a second axis spaced apart from and parallel to said first axis, and providing said drive train with an isolation device having a first position for transmitting rotation power for rotating the element about said second axis and a second position for preventing power from being transmitting over said drive train;

setting said isolation device in either its first or second position;

placing said element upon said rotation structure within a sealed chamber;

immersing said element in a liquid in said chamber, wherein said liquid is one of a cleaning agent and rinsing agent;

spinning said element on said rotation structure while immersing said element in said immersing step such that if said isolation device is in said first position, said element rotates about said first axis and is driven by said drive train to rotate about said second axis, and if said isolation device is in said second position, said element rotates about said first axis and is not powered by said drive train to rotate about said second axis;

removing said liquid from said chamber; and drying said element.

19. A method as claimed in claim 18 further comprising the step of supplying said liquid by one or more ducts to said chamber for said immersing.

20. A method as claimed in claim 19 further comprising the step of heating said liquid prior to said supplying.

21. A method as claimed in claim 18 further comprising providing at least a portion of said chamber with an inside wall and an outside wall spaced from said inside wall and including the step of heating said chamber by circulating a heated liquid between said inside wall and said outside wall during said cleaning.

22. A method as claimed in claim 18 further comprising the step of venting gases from said chamber.

23. A method as claimed in claim 18 further comprising the step of bubbling a gas through liquid in said chamber from at least one port in said chamber during said immersing step.

24. A method as claimed in claim 18 wherein said drying said element is by exposing said element to a gas.

25. A method as claimed in claim 24 wherein said gas is nitrogen.

26. A method as claimed in claim 18 wherein said placing of said element is by positioning said element onto a chuck upon said rotation structure, where said chuck has arms which pivot to lock an element during said spinning, and said arms pivot to release said element when said spinning ceases.

27. A method as claimed in claim 18 where said wherein said removing step comprises draining said liquid through at least one drain in the bottom of said chamber.

* * * * *